United States Patent
Yang et al.

(10) Patent No.: US 9,515,505 B2
(45) Date of Patent: Dec. 6, 2016

(54) CHARGING METHOD AND CHARGING DEVICE USING THE SAME

(71) Applicant: COMPAL ELECTRONICS, INC., Taipei (TW)

(72) Inventors: Yaun-Ren Yang, Taipei (TW); Chia-Ning Yang, Taipei (TW)

(73) Assignee: Compal Electronics, Inc., Taipei (TW)

( * ) Notice: Subject to any disclaimer, the term of this patent is extended or adjusted under 35 U.S.C. 154(b) by 135 days.

(21) Appl. No.: 14/641,972

(22) Filed: Mar. 9, 2015

(65) Prior Publication Data

US 2016/0190843 A1    Jun. 30, 2016

(30) Foreign Application Priority Data

Dec. 30, 2014    (TW) ............................. 103146368 A

(51) Int. Cl.
| | | |
|---|---|---|
| *H02J 7/00* | (2006.01) | |
| *G01R 31/36* | (2006.01) | |
| *H02J 7/04* | (2006.01) | |

(52) U.S. Cl.
CPC ............ *H02J 7/0052* (2013.01); *G01R 31/36* (2013.01); *H02J 7/007* (2013.01); *H02J 7/042* (2013.01); *H02J 7/044* (2013.01); *H02J 7/045* (2013.01)

(58) Field of Classification Search
CPC .................................................... H02J 7/0052
USPC .......................................................... 320/107
See application file for complete search history.

(56) References Cited

U.S. PATENT DOCUMENTS

| | | | | |
|---|---|---|---|---|
| 6,184,659 B1* | 2/2001 | Darmawaskita | ...... | H02J 7/0052 320/137 |
| 7,528,574 B1* | 5/2009 | Adkins | ................. | H01M 10/44 320/128 |
| 2008/0036425 A1* | 2/2008 | Tashiro | ............... | H01M 10/486 320/154 |
| 2008/0036426 A1 | 2/2008 | Kung et al. | | |
| 2010/0201323 A1* | 8/2010 | Okamura | .............. | H02J 7/0072 320/134 |
| 2010/0259226 A1 | 10/2010 | Deng et al. | | |
| 2011/0266998 A1* | 11/2011 | Xiao | ..................... | H02J 7/0073 320/107 |
| 2014/0111141 A1 | 4/2014 | Chan et al. | | |

FOREIGN PATENT DOCUMENTS

| | | |
|---|---|---|
| CN | 101222144 | 7/2008 |
| TW | 201318309 | 5/2013 |

* cited by examiner

*Primary Examiner* — Yalkew Fantu
(74) *Attorney, Agent, or Firm* — Kirton McConkie; Evan R. Witt

(57) ABSTRACT

A charging method is provided for charging a battery unit. Firstly, a current change amount is set, and a predetermined time interval is determined according to characteristics of the battery unit. When the charging device is enabled, a charging current with a constant current value is provided to charge the battery unit. If a detected parameter of the battery unit reaches the threshold value, a constant charging voltage is provided to the battery unit. Moreover, the current value of the charging current is decreased by the current change amount. The number of times the current change amount is decreased is determined according to a predetermined counting value. That is, the current value of the charging current is stepwise decreased according to a time control mechanism.

15 Claims, 5 Drawing Sheets

CHARGING METHOD AND CHARGING DEVICE USING THE SAME

FIELD OF THE INVENTION

The present invention relates to a charging method and a charging device using the charging method, and more particularly to a charging method for stepwise decreasing a current value of a charging current according to a time control mechanism and a charging device using the charging method.

BACKGROUND OF THE INVENTION

With increasing development of electronic industries, portable electronic devices such as smart phones are widely used in our daily lives. Generally, these portable electronic devices use chargeable battery units as power sources. Since the storage capacity of the battery unit is limited, it is necessary to frequently charge the battery unit.

Conventionally, a constant current and constant voltage charging method is used to charge the battery unit. Firstly, the battery unit is charged in a constant current mode. When the voltage of the battery unit reaches a threshold value, the battery unit is charged in a constant voltage mode. At the same time, the charging current is abruptly decreased, and the battery unit is charged at a lower charging rate. Consequently, the safety and the life span of the battery unit can be enhanced. However, since battery unit is charged by the lower charging current in the constant voltage mode, the overall charging time period of the battery unit is very long.

Recently, some charging methods and some charging devices are disclosed for solving the above problems. For example, while the battery unit is charged in the constant voltage mode and the voltage of the battery unit is gradually increased, the voltage of the battery unit is continuously detected. When the voltage of the battery unit reaches different threshold voltage values, the magnitudes of the charging current are decreased by a small change amount. In other words, the charging current is stepwise decreased instead of being abruptly decreased. Consequently, the overall charging time period of the battery unit is shortened.

Although the above charging methods and charging devices can effectively shorten the overall charging time period of the battery unit, there are still some drawbacks. For example, since the magnitude of the charging current is decreased by a small change amount during the charging process, the voltage change amount of the battery unit is very small. Since the voltage change amount of the battery unit is very small, it is difficult to detect the voltage change amount of the battery unit. For precisely detecting the voltage change amount of the battery unit, the charging device should be equipped with an elaborate voltage detecting unit. Under this circumstance, the fabricating cost of the charging device is increased. Moreover, if the voltage detecting unit is interfered by the noise from other circuits of the charging device, the voltage value detected by the voltage detecting unit is possibly inaccurate. Since the detected result cannot reflect the small change amount of the real voltage value of the battery unit, the performance of the charging method is deteriorated and the safety and the life span of the battery unit are reduced.

Therefore, there is a need of providing an improved charging method and an improved charging device in order to overcome the above drawbacks.

SUMMARY OF THE INVENTION

An object of the present invention provides a charging method and a charging device using the charging method. Firstly, a battery unit is charged in a constant current mode. Then, the battery unit is charged in a constant voltage mode. In the constant voltage mode, the current value of the charging current is stepwise decreased according to a time control mechanism. In comparison with the conventional charging method of stepwise decreasing the charging current according to the detected voltage value, the charging method of the present invention is more accurate and feasible. Consequently, the performance of the charging method is enhanced and the safety and the life span of the battery unit are increased. Moreover, since the charging device does not need to be equipped with the elaborate voltage detecting unit, the charging device of the present invention is more cost-effective.

In accordance with an aspect of the present invention, there is provided a charging method for charging a battery unit by a charging device. In a step (a), a current change amount is set, and a predetermined time interval is determined according to characteristics of the battery unit. In a step (b), a charging current is provided to charge the battery unit when the charging device is enabled, wherein a current value of the charging current is constant. Then, a step (c) is performed to judge whether a detected parameter of the battery unit reaches a threshold value. In a step (d), if the detected parameter of the battery unit reaches the threshold value in the step (c), a constant charging voltage is provided to the battery unit, and the current value of the charging current is decreased by the current change amount. In a step (e), a counting value is accumulated by 1. In a step (f), an elapsed time period after the step (e) is counted. Then, the step (g) is performed to judge whether the elapsed time is shorter than the predetermined time interval. If the elapsed time is not shorter than the predetermined time interval in the step (g), a step (h) is performed to judge whether the accumulated counting value is smaller than a predetermined counting value. In a step (i), if the accumulated counting value is smaller than the predetermined counting value in the step (h), the step (d) is repeatedly done. In a step (j), if the accumulated counting value is not smaller than the predetermined counting value in the step (h), the current value of the charging current is maintained, and the step (c) is repeatedly done.

In accordance with another aspect of the present invention, there is provided a charging device for implementing the charging method of the present invention. The charging device includes an electric energy adjusting unit, a detecting unit and a controlling unit. The electric energy adjusting unit is electrically connected with a power supply unit for receiving an input electric energy from the power supply unit and converting the input electric energy into the charging voltage and the charging current. The detecting unit is electrically connected with the battery unit for outputting a detecting signal according to a result of detecting whether the detected parameter of the battery unit reaches the threshold value. The controlling unit is electrically connected with the detecting unit and the electric energy adjusting unit for receiving the detecting signal and controlling the electric energy adjusting unit. The predetermined counting value is previously stored in the controlling unit, and the predetermined time interval is previously stored in the controlling unit according to the characteristics of the battery unit. Moreover, the controlling unit has a counter for accumulating the counting value.

In accordance with a further aspect of the present invention, there is provided a charging method for charging a battery unit by a charging device. In a step (a), a current change amount is set, and a predetermined time interval is determined according to characteristics of the battery unit. In a step (b), a charging current is provided to charge the battery unit when the charging device is enabled, wherein a current value of the charging current is constant. Then, a step (c) is performed to judge whether a detected parameter of the battery unit reaches a threshold value. In a step (d), if the detected parameter of the battery unit reaches the threshold value in the step (c), a constant charging voltage is provided to the battery unit, and the current value of the charging current is decreased by the current change amount. In a step (e), a counting value is accumulated by 1. In a step (f), an elapsed time period after the step (e) is counted. Then, the step (g) is performed to judge whether the elapsed time is shorter than the predetermined time interval. If the elapsed time is not shorter than the predetermined time interval in the step (g), a step (h) is performed to judge whether the accumulated counting value is smaller than a predetermined counting value. In a step (i), if the accumulated counting value is smaller than the predetermined counting value in the step (h), the step (d) is repeatedly done. In a step (j), if the accumulated counting value is not smaller than the predetermined counting value in the step (h), the current value of the charging current is maintained. In a step (k), the predetermined counting value and the predetermined time interval are adjusted, and the step (c) is repeatedly done.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
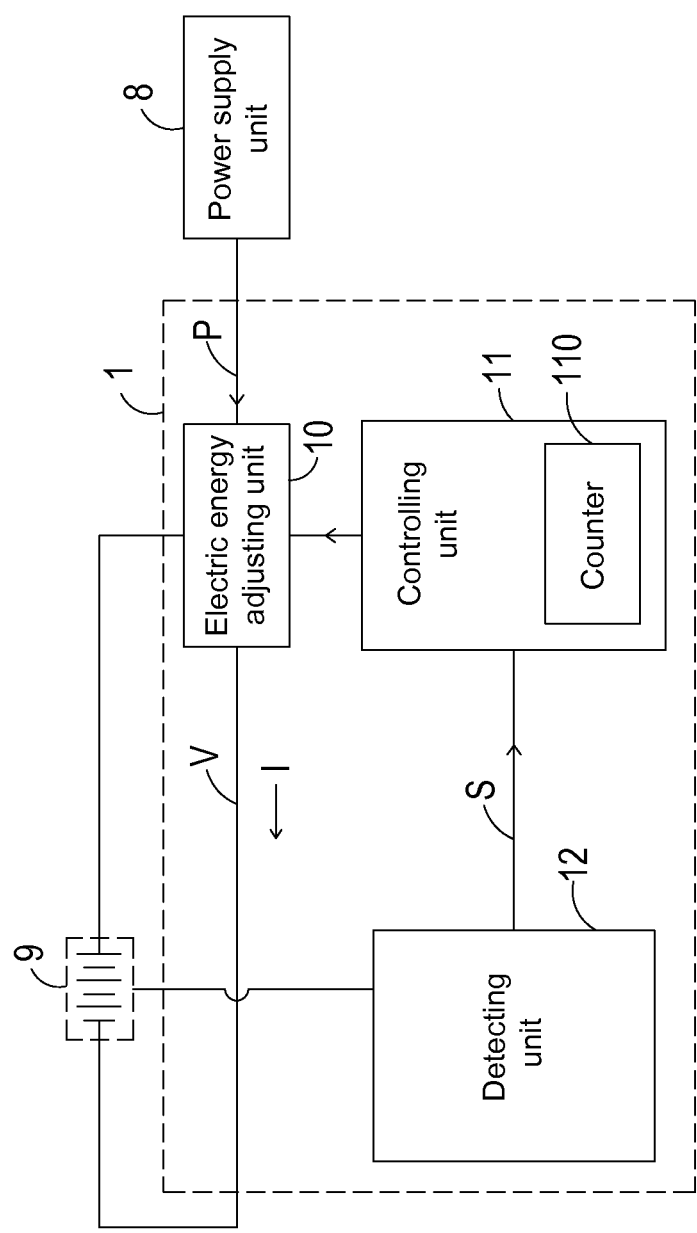
FIG. 1 is a schematic circuit diagram illustrating a charging device according to an embodiment of the present invention.

FIG. 1 is a schematic circuit diagram illustrating a charging device according to an embodiment of the present invention. As shown in FIG. 1, the charging device 1 is electrically connected with a power supply unit 8 and a battery unit 9. The charging device 1 may receive input electric energy P from the power supply unit 8 and convert the input electric energy P into an adjustable charging voltage V and/or an adjustable charging current I so as to charge the battery unit 9.

Preferably but not exclusively, the charging device 1 may charge the battery unit 9 by a constant current and constant voltage charging method. In the early stage, the battery unit 9 is charged in a constant current mode. Meanwhile, the current value of the charging current I is constant. When a detected parameter of the battery unit 9 reaches a threshold value, the battery unit 9 is charged in a constant voltage mode. Meanwhile, the voltage value of the charging voltage V is constant. If the current value of the charging current I is smaller than a predetermined saturation current value in the constant voltage mode, it is determined that the battery unit 9 is in a saturation state. Consequently, the charging device 1 is disabled, and the battery unit 9 is no longer charged by the charging device 1. An example of the battery unit 9 includes but is not limited to a lithium battery or any other appropriate chargeable battery.

In this embodiment, the charging device 1 comprises an electric energy adjusting unit 10, a controlling unit 11 and a detecting unit 12. The electric energy adjusting unit 10 is electrically connected with the power supply unit 8 and the battery unit 9. The electric energy adjusting unit 10 is used for converting the input electric energy P into the adjustable charging voltage V and/or the adjustable charging current I so as to charge the battery unit 9.

The detecting unit 12 is electrically connected with the battery unit 9. Moreover, the detecting unit 12 is used for measuring the detected parameter and judging whether the detected parameter of the battery unit 9 reaches the threshold value and generating a detecting signal S according to the judging result.

An example of the detected parameter of the battery unit 9 includes but is not limited to a detected capacity percentage of the battery unit 9, a detected voltage of the battery unit 9, a detected temperature of the battery unit 9 and/or a detected charging time period of the battery unit 9. The threshold value corresponding to the detected parameter of the battery unit 9 includes but is not limited to a threshold capacity percentage, a threshold voltage, a threshold temperature and/or a threshold charging time period. Moreover, the circuitry configuration of the detecting unit 12 is determined according to the type of the detected parameter of the battery unit 9. For example, if the detecting unit 12 is used to detect the detected voltage of the battery unit 9, the detecting unit 12 comprises the functional circuits or the electronic components for detecting the voltage.

The controlling unit 11 is electrically connected with the detecting unit 12 and the electric energy adjusting unit 10. The controlling unit 11 may receive the detecting signal S. Moreover, an adjustable predetermined counting value is previously stored in the controlling unit 11, and an adjustable predetermined time interval is previously stored in the controlling unit 11 according to the characteristics of the battery unit 9. Moreover, the controlling unit 11 further comprises a counter 110 for accumulating a counting value. When the charging device 1 is enabled, the controlling unit 11 controls the electric energy adjusting unit 10 to output the charging current I to charge the battery unit 9, wherein the current value of the charging current I is constant. That is, the battery unit 9 is charged in a constant current mode. When the controlling unit 11 realizes that the detected parameter reaches the threshold value according to the detecting signal S, the controlling unit 11 controls the electric energy adjusting unit 10 to output the charging current I and the charging voltage V to charge the battery unit 9, wherein the voltage value of the charging voltage V is constant. That is, the battery unit 9 is charged in a constant voltage mode. Moreover, when the controlling unit 11 realizes that the detected parameter reaches the threshold value according to the detecting signal S, the controlling unit 11 controls the electric energy adjusting unit 10 to decrease the charging current I by a current change amount Ir (see FIG. 3) according to the stored setting values of the controlling unit 11. Then, the counter 110 of the controlling unit 11 accumulates the counting value by 1 and starts counting an elapsed time period Tv (see FIG. 3). If the elapsed time period Tv is longer than or equal to (i.e. not shorter than) the predetermined time interval, the controlling unit 11 controls the electric energy adjusting unit 10 to decrease the charging current I by the current change amount Ir again. The above steps of accumulating the counting value and counting the elapsed time period Tv are repeatedly done until the accumulated counting value is equal to the predetermined counting value, and then the subsequently steps are performed.

From the above descriptions, while the battery unit 9 is charged in the constant voltage mode by the charging device 1, the current value of the charging current I is stepwise decreased. Moreover, when the detected parameter of the battery unit 9 reaches the threshold value, the current value of the charging current I is decreased by the current change amount Ir. As the counting value is increased, the current value of the charging current I is decreased by the current change amount Ir at the predetermined time interval.

Generally, the battery unit 9 has an internal resistance value. If the current value of the charging current I received by the battery unit 9 is decreased in the constant voltage mode, the voltage of the battery unit 9 is firstly decreased at a drop rate and then increased at a rise rate. The drop rate and the rise rate of the varying voltage of the battery unit 9 relative to the varying time are determined according to the current change amount Ir. Since the time point of decreasing the charging current I by the current change amount Ir at the first time and the time point of decreasing the charging current I by the current change amount Ir at the second time are recognized, the elapsed time Tv between these two time points can be calculated. In particular, the predetermined time interval may be calculated according to the internal resistance value R of the battery unit 9, the current change amount Ir, the drop rate of the varying voltage of the battery unit 9 relative to the varying time and the rise rate of the varying voltage of the battery unit 9 relative to the varying time, i.e. $T=R\times\Delta I(|1/r1|+|1/r2|)$, wherein T is the predetermined time interval, R is the internal resistance value of the battery unit 9, $\Delta I$ is the current change amount Ir, r1 is the drop rate of the varying voltage of the battery unit 9 relative to the varying time, and r2 is the rise rate of the varying voltage of the battery unit 9.

Figure 2:
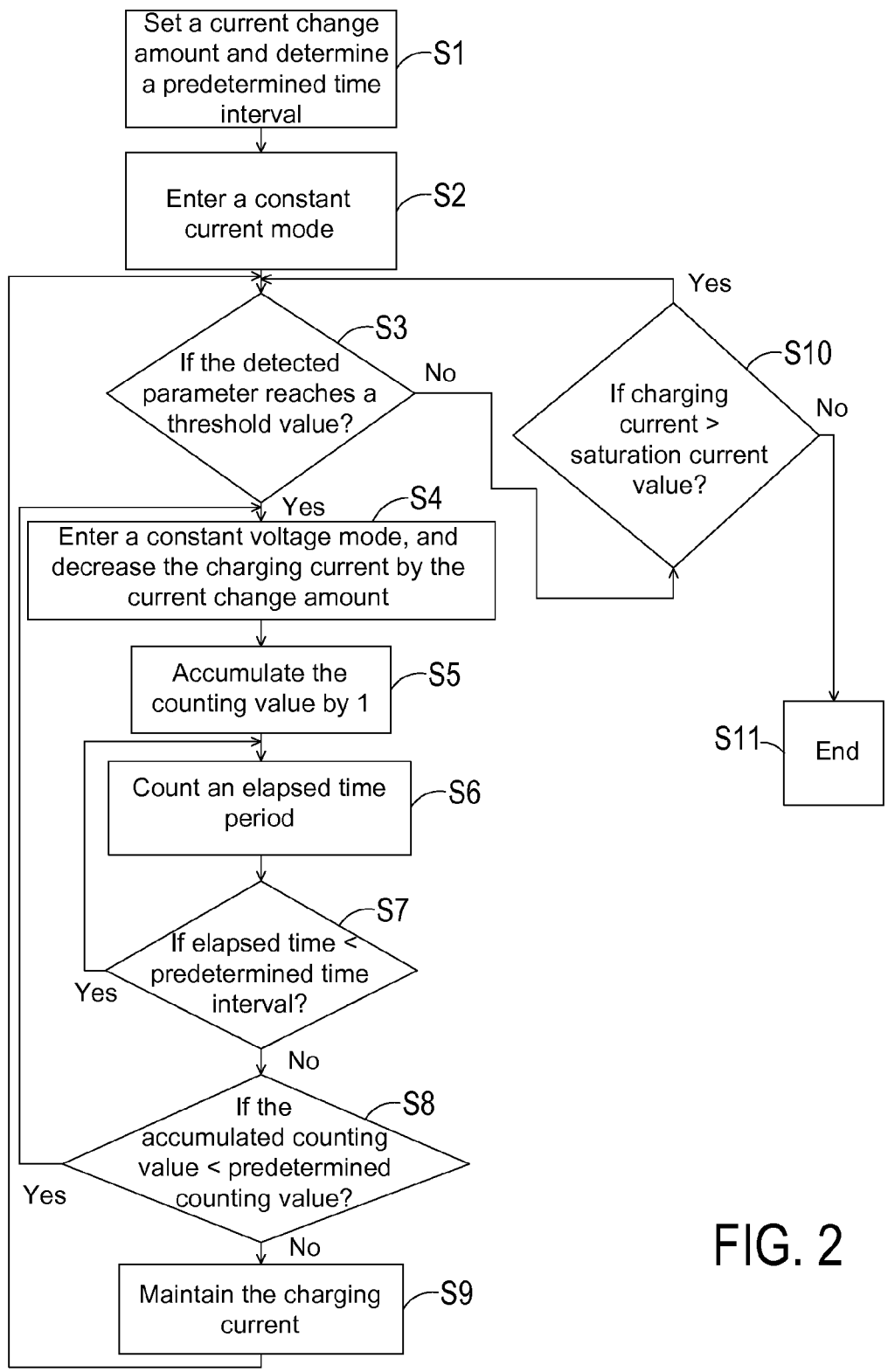
FIG. 2 is a flowchart illustrating a charging method of the charging device according to a first embodiment of the present invention.

FIG. 2 is a flowchart illustrating a charging method of the charging device according to a first embodiment of the present invention. Please refer to FIGS. 1 and 2. Firstly, in a step S1, a current change amount is set, and a predetermined time interval is determined by the controlling unit 11 of the charging device 1 according to the characteristics of the battery unit 9. In a step S2, the charging device 1 is enabled to provide a charging current I to charge the battery unit 9, wherein a current value of the charging current I is constant. Namely, the controlling unit 11 controls the electric energy adjusting unit 10 to output a constant charging current I to charge the battery unit 9. Then, in a step S3, the controlling unit 11 judges whether the detected parameter of the battery unit 9 reaches the threshold value according to the detecting signal S.

If the judging condition of the step S3 is satisfied, the step S4 is performed. In the step S4, the controlling unit 11 controls the electric energy adjusting unit 10 to output the charging voltage V to charge the battery unit 9, wherein the voltage value of the charging voltage V is constant. That is, the battery unit 9 is charged in a constant voltage mode. In addition, the controlling unit 11 controls the electric energy adjusting unit 10 to decrease the charging current I by a current change amount Ir. Then, in a step S5, the counter 110 of the controlling unit 11 accumulates the counting value by 1. Then, in a step S6, an elapsed time period after the step S5 is counted by the controlling unit 11. Then, in a step S7, the controlling unit 11 judges whether the elapsed time is shorter than the predetermined time interval.

If the judging condition of the step S7 is satisfied, the step S6 is repeatedly done. Whereas, if the judging condition of the step S7 is not satisfied, a step S8 is performed. In the step S8, the controlling unit 11 judges whether the accumulated counting value is smaller than a predetermined counting value.

If the judging condition of the step S8 is satisfied, the step S4 is repeatedly done. Whereas, if the judging condition of the step S8 is not satisfied, a step S9 is performed. In the step S9, the current value of the charging current I for charging the battery unit 9 is maintained by the control of the controlling unit 11. After the step S9, the step S3 is repeatedly done.

In addition, if the judging condition of the step S3 is not satisfied, a step S10 is performed. In the step S10, the controlling unit 11 judges whether the current value of the charging current I is larger than a saturation current value. If the judging condition of the step S10 is not satisfied, the charging method is ended (Step S11). Whereas, if the judging condition of the step S10 is satisfied, the step S3 is repeatedly done.

Moreover, in the step S9, the counting value of the counter 110 is zeroed by the controlling unit 11. In an embodiment, the predetermined counting value stored in the controlling unit 11 is at least two. Moreover, an initial counting value of the counter 110 is zero, but is not limited thereto.

Figure 3:
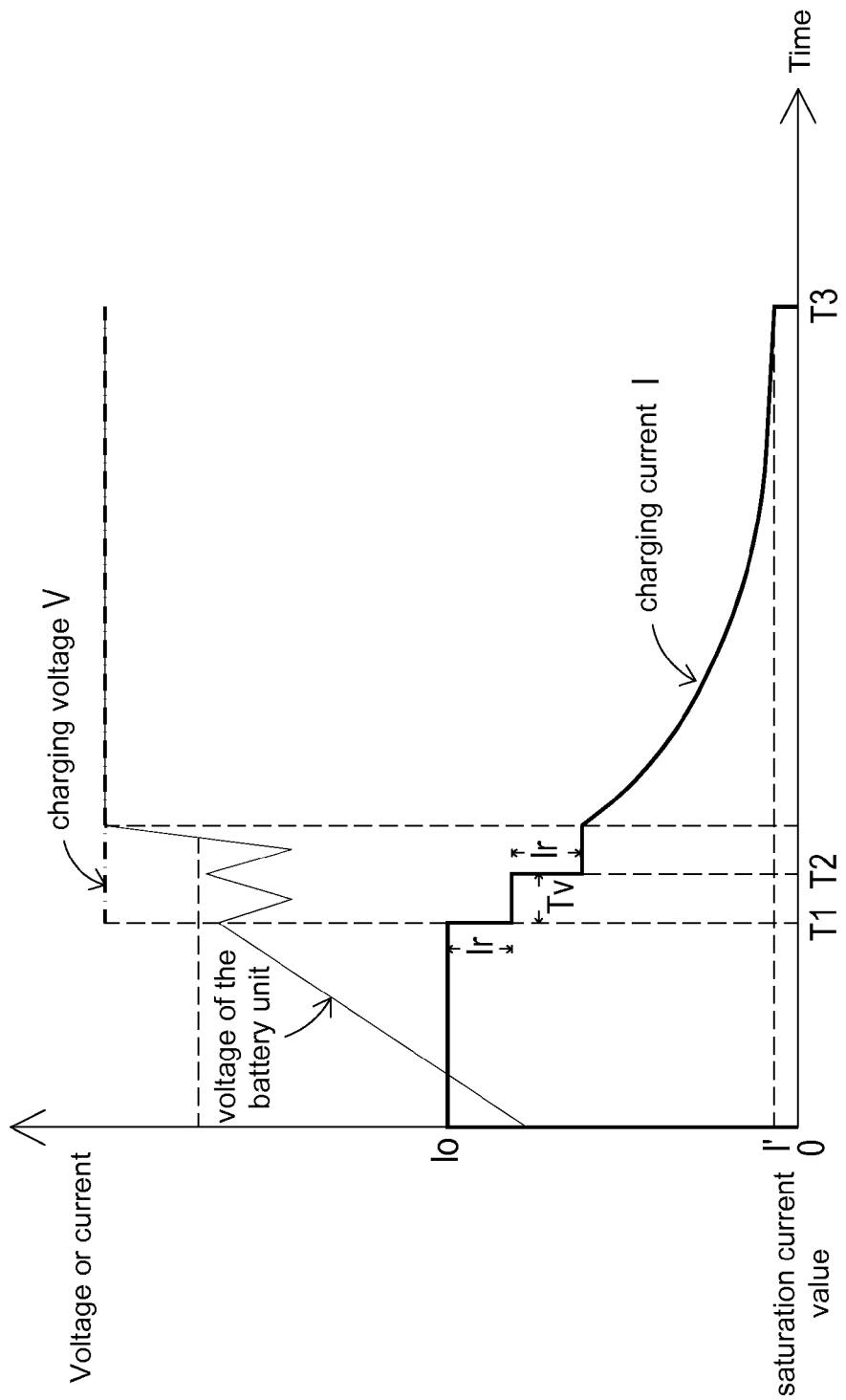
FIG. 3 is a schematic timing diagram illustrates the relationship between the charging voltage, the charging current and the voltage of the charging unit during the charging process of the battery unit by using the charging device of FIG. 1 and the charging method of FIG. 2.

FIG. 3 is a schematic timing diagram illustrates the relationship between the charging voltage, the charging current and the voltage of the charging unit during the charging process of the battery unit by using the charging device of FIG. 1 and the charging method of FIG. 2. In this embodiment, the predetermined counting value is two. Please to FIGS. 1, 2 and 3. At the time point 0, the charging device 1 is enabled. Consequently, the controlling unit 11 controls the electric energy adjusting unit 10 to output the charging current I to charge the battery unit 9, wherein the current value Io of the charging current I is constant (i.e. a preset current value). That is, the battery unit 9 is charged in a constant current mode. At the time point T1, the controlling unit 11 judges that the detected parameter of the battery unit 9 reaches the threshold value according to the detecting signal S. Consequently, the controlling unit 11 controls the electric energy adjusting unit 10 to output the charging voltage V to charge the battery unit 9, wherein the voltage value of the charging voltage V is constant. That is, the battery unit 9 is charged in a constant voltage mode. In addition, the controlling unit 11 controls the electric energy adjusting unit 10 to decrease the charging current I by a current change amount Ir. Meanwhile, the current value of the charging current I is decreased from the original current value Io to the new current value (Io−Ir). Then, the counter 110 of the controlling unit 11 accumulates the counting value by 1. Then, an elapsed time period Tv is counted by the controlling unit 11. At the time point T2, the controlling unit 11 judges that the elapsed time period Tv between the time point T1 and the time point T2 is longer than or equal to (i.e. not shorter than) the predetermined time interval. Since the accumulated counting value (=1) is smaller than the predetermined counting value (=2) at this moment, the controlling unit 11 controls the electric energy adjusting unit 10 to decrease the charging current I by the current change amount Ir again. Consequently, the current value of the charging current I is decreased from the original current value (Io−Ir) to the new current value (Io−2×Ir). Then, the counter 110 of the controlling unit 11 accumulates the counting value by 1. After the time point T2, the controlling unit 11 judges that the accumulated counting value is not smaller than the predetermined counting value. Consequently, the current value of the charging current I is maintained at the original current value (Io−2×Ir), and the battery unit 9 is charged in the constant voltage mode. When the voltage value of the battery unit 9 is close to the voltage value of the charging voltage, the current value of the charging current I is gradually decreased. At the time point T3, the controlling unit 11 judges that the current value of the charging current I is not larger than the saturation current value I'. Consequently, the charging device 1 is disabled, and the battery unit 9 is no longer charged by the charging device 1.

In the above embodiment, every time when the detected parameter of the battery unit 9 reaches the threshold value, the controlling unit 11 controls the electric energy adjusting unit 10 to decrease the charging current I by the same current change amount Ir. Alternatively, in some other embodiments, every time when the detected parameter of the battery unit 9 reaches the threshold value, the controlling unit 11 controls the electric energy adjusting unit 10 to decrease the charging current I by different current change amount. For example, after the detected parameter of the battery unit 9 reaches the threshold value and the current value of the charging current I is stepwise decreased according to the predetermined counting value, the current change amount is adjusted according to a set value stored in the controlling unit 11. Alternatively, in some other embodiments, when the detected parameter of the battery unit 9 reaches the threshold value, the controlling unit 11 controls the electric energy adjusting unit 10 to decrease the charging current I by the adjusted current change amount. As mentioned above, the predetermined time interval may be calculated by the formula: $T=R\times\Delta I(|1/r1-+|1/r2|)$. Consequently, in case that the current change amount is changed, the predetermined time interval is correspondingly changed. When the detected parameter of the battery unit 9 reaches the threshold value, if the elapsed time period is longer than or equal to the adjusted predetermined time interval, the controlling unit 11 controls the electric energy adjusting unit 10 to decrease the charging current I by the adjusted current change amount again.

Figure 4:
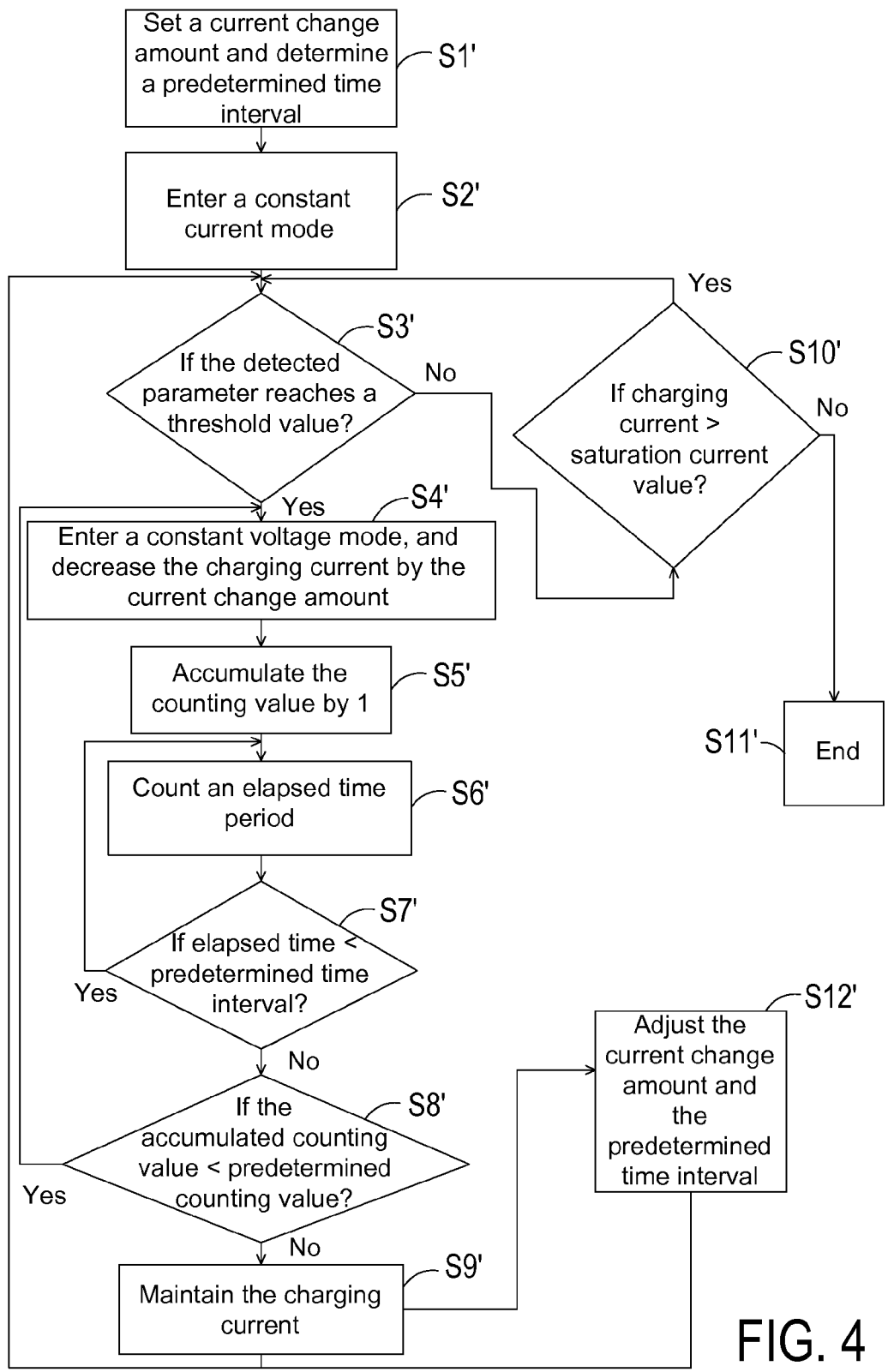
FIG. 4 is a flowchart illustrating a charging method of the charging device according to a second embodiment of the present invention.

FIG. 4 is a flowchart illustrating a charging method of the charging device according to a second embodiment of the present invention. Please refer to FIGS. 1 and 4. Firstly, in a step S1', a current change amount is set, and a predetermined time interval is determined by the controlling unit 11 according to the characteristics of the battery unit 9. In a step S2', the charging device 1 is enabled to provide a charging current I to charge the battery unit 9, wherein a current value of the charging current I is constant. Namely, the controlling unit 11 controls the electric energy adjusting unit 10 to output a constant charging current I to charge the battery unit 9. Then, in a step S3', the controlling unit 11 judges whether the detected parameter of the battery unit 9 reaches the threshold value according to the detecting signal S.

If the judging condition of the step S3' is satisfied, the step S4' is performed. In the step S4', the controlling unit 11 controls the electric energy adjusting unit 10 to output the charging voltage V to charge the battery unit 9, wherein the voltage value of the charging voltage V is constant. That is, the battery unit 9 is charged in a constant voltage mode. In addition, the controlling unit 11 controls the electric energy adjusting unit 10 to decrease the charging current I by the current change amount Ir. Then, in a step S5', the counter 110 of the controlling unit 11 accumulates the counting value by 1. Then, in a step S6', an elapsed time period after the step S5' is counted by the controlling unit 11. Then, in a step S7', the controlling unit 11 judges whether the elapsed time is shorter than the predetermined time interval.

If the judging condition of the step S7' is satisfied, the step S6' is repeatedly done. Whereas, if the judging condition of the step S7' is not satisfied, a step S8' is performed. In the step S8', the controlling unit 11 judges whether the accumulated counting value is smaller than a predetermined counting value.

If the judging condition of the step S8' is satisfied, the step S4' is repeatedly done. Whereas, if the judging condition of the step S8' is not satisfied, a step S9' is performed. In the step S9', the current value of the charging current I for charging the battery unit 9 is maintained by the controlling of the control unit 11. After the step S9', a step S12' is performed. In the step S12', the current change amount is adjusted, and thus the predetermined time interval is correspondingly adjusted. After the step S12', the step S3' is repeatedly done.

In addition, if the judging condition of the step S3' is not satisfied, a step S10' is performed. In the step S10', the controlling unit 11 judges whether the current value of the charging current I is larger than a saturation current value. If the judging condition of the step S10' is not satisfied, the charging method is ended (Step S11'). Whereas, if the judging condition of the step S10' is satisfied, the step S3' is repeatedly done.

Moreover, in the step S9', the counting value of the counter 110 is zeroed by the controlling unit 11. In an embodiment, the predetermined counting value stored in the controlling unit 11 is at least two. Moreover, an initial counting value of the counter 110 is zero, but is not limited thereto. Moreover, in the step S12', the current change amount is adjusted according to a set value stored in the controlling unit 11.

Figure 5:
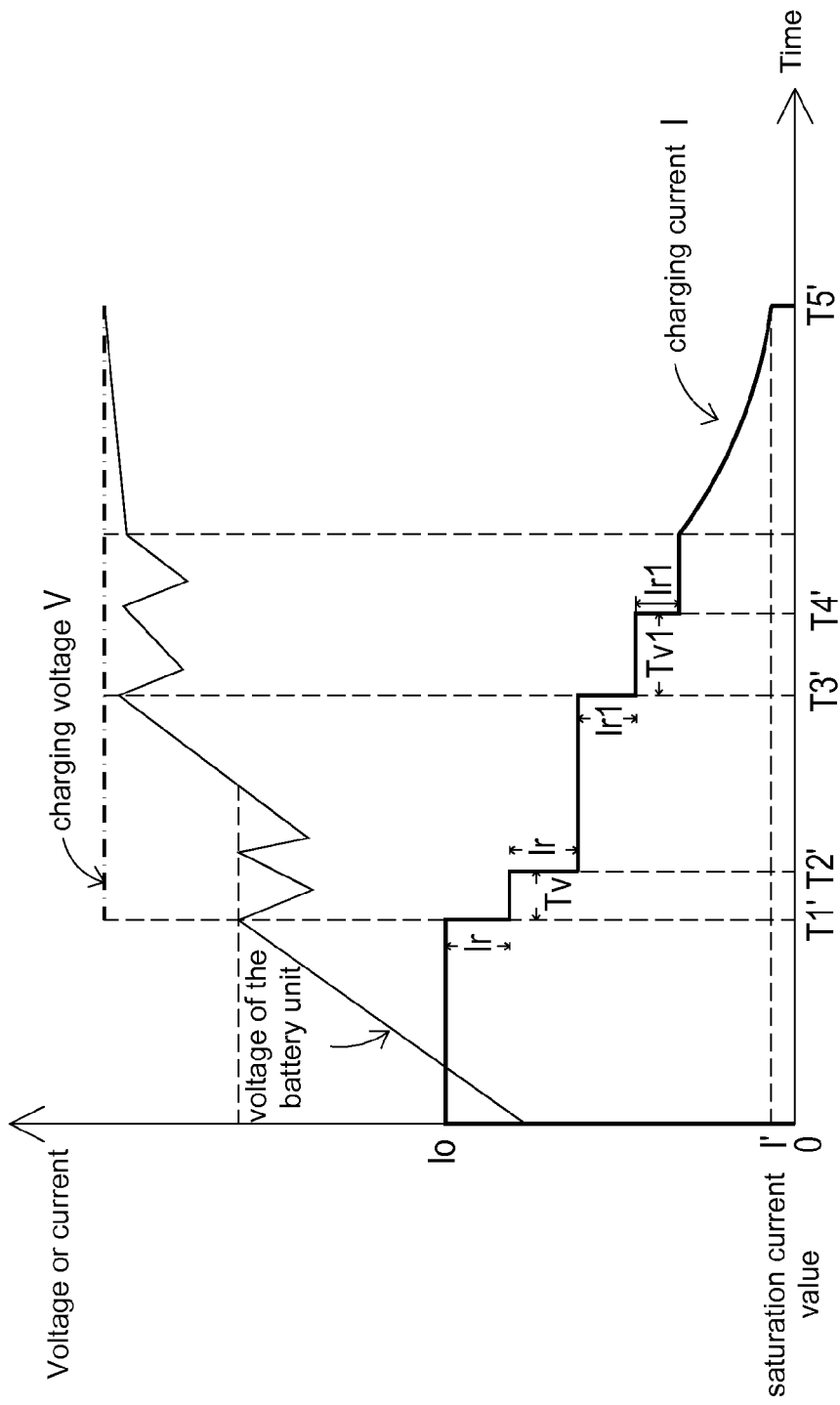
FIG. 5 is a schematic timing diagram illustrates the relationship between the charging voltage, the charging current and the voltage of the charging unit during the charging process of the battery unit by using the charging device of FIG. 1 and the charging method of FIG. 4.

FIG. 5 is a schematic timing diagram illustrates the relationship between the charging voltage, the charging current and the voltage of the charging unit during the charging process of the battery unit by using the charging device of FIG. 1 and the charging method of FIG. 4. In this embodiment, the predetermined counting value is two, and the detected parameter of the battery unit 9 reaches the threshold value twice.

Please refer to FIGS. 1, 4 and 5. At the time point 0, the charging device 1 is enabled. Consequently, the controlling unit 11 controls the electric energy adjusting unit 10 to output the charging current I to charge the battery unit 9, wherein the current value Io of the charging current I is constant (i.e. a preset current value). That is, the battery unit 9 is charged in a constant current mode. At the time point T1', the controlling unit 11 judges that the detected parameter of the battery unit 9 reaches the threshold value for the first time according to the detecting signal S. Consequently, the controlling unit 11 controls the electric energy adjusting unit 10 to output the charging voltage V to charge the battery unit 9, wherein the voltage value of the charging voltage V is constant. That is, the battery unit 9 is charged in a constant voltage mode. In addition, the controlling unit 11 controls the electric energy adjusting unit 10 to decrease the charging current I by a current change amount Ir. Meanwhile, the current value of the charging current I is decreased from the original current value Io to the new current value (Io−Ir). Then, the counter 110 of the controlling unit 11 accumulates the counting value by 1. Then, an elapsed time period Tv is counted by the controlling unit 11. At the time point T2', the controlling unit 11 judges that the elapsed time period Tv between the time point T1' and the time point T2' is longer than or equal to (i.e. not shorter than) the predetermined time interval. Since the accumulated counting value (=1) is smaller than the predetermined counting value (=2) at this moment, the controlling unit 11 controls the electric energy adjusting unit 10 to decrease the charging current I by the current change amount Ir again. Consequently, the current value of the charging current I is decreased from the original current value (Io−Ir) to the new current value (Io−2×Ir). Then, the counter 110 of the controlling unit 11 accumulates the counting value by 1. After the time point T2', the controlling unit 11 judges that the accumulated counting value is not smaller than the predetermined counting value. Consequently, the current value of the charging current I is maintained at the original current value (Io−2×Ir), and the battery unit 9 is charged in the constant voltage mode. Then, the current change amount Ir is adjusted to another current change amount Ir1, and the predetermined time interval is correspondingly adjusted.

At the time point T3', the controlling unit 11 judges that the detected parameter of the battery unit 9 reaches the threshold value for the second time according to the detecting signal S. Consequently, the controlling unit 11 controls the electric energy adjusting unit 10 to decrease the charging current I by the adjusted current change amount Ir1. Meanwhile, the current value of the charging current I is decreased from the original current value (Io−2×Ir) to the new current value (Io−2×Ir−Ir1). Then, the counter 110 of the controlling unit 11 accumulates the counting value by 1. Then, an elapsed time period Tv1 is counted by the controlling unit 11. At the time point T4', the controlling unit 11 judges that the elapsed time period Tv1 between the time point T3' and the time point T4' is longer than or equal to (i.e. not shorter than) the adjusted predetermined time interval. Since the accumulated counting value (=1) is smaller than the predetermined counting value (=2) at this moment, the controlling unit 11 controls the electric energy adjusting unit 10 to decrease the charging current I by the adjusted current change amount Ir1 again. Consequently, the current value of the charging current I is decreased from the original current value (Io−2×Ir−Ir1) to the new current value (Io−2×Ir−2×Ir1). Then, the counter 110 of the controlling unit 11 accumulates the counting value by 1. After the time point T4', the controlling unit 11 judges that the accumulated counting value is not smaller than the predetermined counting value. Consequently, the current value of the charging current I is maintained at the original current value (Io−2×Ir−2×Ir1), and the battery unit 9 is charged in the constant voltage mode. When the voltage value of the battery unit 9 is close to the voltage value of the charging voltage, the current value of the charging current I is gradually decreased. At the time point T5', the controlling unit 11 judges that the current value of the charging current I is not larger than the saturation current value I'. Consequently, the charging device 1 is disabled, and the battery unit 9 is no longer charged by the charging device 1.

From the above descriptions, the present invention provides a charging method and a charging device using the charging method. Firstly, a battery unit is charged in a constant current mode. When the detected parameter of the battery unit reaches the threshold value, the battery unit is charged in a constant voltage mode, and the current value of the charging current is decreased by a current change amount. As the counting value is increased, the current value of the charging current is decreased by the current change amount at the predetermined time interval. That is, the current value of the charging current is stepwise decreased according to a time control mechanism. In comparison with the conventional charging method of stepwise decreasing the charging current according to the detected voltage, the charging method of the present invention is more accurate and feasible. Consequently, the performance of the charging method is enhanced and the safety and the life span of the battery unit are increased. Moreover, since the charging device does not need to be equipped with the elaborate voltage detecting unit, the charging device of the present invention is more cost-effective.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A charging method for charging a battery unit by a charging device, the charging method comprising steps of:
   (a) setting a current change amount, and determining a predetermined time interval according to characteristics of the battery unit;
   (b) providing a charging current to charge the battery unit when the charging device is enabled, wherein a current value of the charging current is constant;
   (c) judging whether a detected parameter of the battery unit reaches a threshold value;
   (d) if the detected parameter of the battery unit reaches the threshold value in the step (c), providing a constant charging voltage to the battery unit, and decreasing the current value of the charging current by the current change amount;
   (e) accumulating a counting value by 1;
   (f) starting counting an elapsed time period after the step (e);
   (g) judging whether the elapsed time is shorter than the predetermined time interval;
   (h) if the elapsed time is not shorter than the predetermined time interval in the step (g), judging whether the accumulated counting value is smaller than a predetermined counting value;
   (i) if the accumulated counting value is smaller than the predetermined counting value in the step (h), repeatedly performing the step (d); and
   (j) if the accumulated counting value is not smaller than the predetermined counting value in the step (h), maintaining the current value of the charging current, and the step (c) is repeatedly done.

2. The charging method according to claim 1, wherein if the detected parameter of the battery unit does not reach the threshold value in the step (c), the charging method further comprises a step (k) of judging whether the current value of the charging current is larger than a saturation current value.

3. The charging method according to claim 2, wherein if the current value of the charging current is larger than the saturation current value in the step (k), the step (c) is repeatedly done, wherein if the current value of the charging current is not larger than the saturation current value in the step (k), the charging device is disabled and the battery unit is no longer charged by the charging device.

4. The charging method according to claim 1, wherein in the step (j), the counting value is zeroed.

5. The charging method according to claim 1, wherein if the elapsed time is shorter than the predetermined time interval in the step (g), the step (f) is repeatedly done.

6. The charging method according to claim 1, wherein the predetermined time interval is calculated by a formula: $T = R \times \Delta I (|1/r1| + |1/r2|)$, wherein T is the predetermined time interval, R is an internal resistance value of the battery unit, $\Delta I$ is the current change amount, r1 is a drop rate of a varying voltage of the battery unit relative to a varying time, and r2 is a rise rate of the varying voltage of the battery unit relative to the varying time.

7. The charging method according to claim 1, wherein the predetermined counting value is at least two.

8. The charging method according to claim 1, wherein the detected parameter of the battery unit includes a detected capacity percentage of the battery unit, a detected voltage of the battery unit, a detected temperature of the battery unit and/or a detected charging time period of the battery unit.

9. The charging method according to claim 8, wherein the threshold value includes a threshold capacity percentage, a threshold voltage, a threshold temperature and/or a threshold charging time period.

10. A charging device for implementing the charging method according to claim 1, the charging device comprising:
   an electric energy adjusting unit electrically connected with a power supply unit for receiving an input electric energy from the power supply unit and converting the input electric energy into the charging voltage and the charging current;
   a detecting unit electrically connected with the battery unit for outputting a detecting signal according to a result of detecting whether the detected parameter of the battery unit reaches the threshold value; and
   a controlling unit electrically connected with the detecting unit and the electric energy adjusting unit for receiving the detecting signal and controlling the electric energy adjusting unit, wherein the predetermined counting value is previously stored in the controlling unit, and the predetermined time interval is previously stored in the controlling unit according to the characteristics of the battery unit, wherein the controlling unit has a counter for accumulating the counting value.

11. A charging method for charging a battery unit by a charging device, the charging method comprising steps of:
   (a) setting a current change amount, and determining a predetermined time interval according to characteristics of the battery unit;
   (b) providing a charging current to charge the battery unit when the charging device is enabled, wherein a current value of the charging current is constant;
   (c) judging whether a detected parameter of the battery unit reaches a threshold value;
   (d) if the detected parameter of the battery unit reaches the threshold value in the step (c), providing a constant charging voltage to the battery unit, and decreasing the current value of the charging current by the current change amount;
   (e) accumulating a counting value by 1;
   (f) starting counting an elapsed time period after the step (e);
   (g) judging whether the elapsed time is shorter than the predetermined time interval;
   (h) if the elapsed time is not shorter than the predetermined time interval in the step (g), judging whether the accumulated counting value is smaller than a predetermined counting value;
   (i) if the accumulated counting value is smaller than the predetermined counting value in the step (h), repeatedly performing the step (d);
   (j) if the accumulated counting value is not smaller than the predetermined counting value in the step (h), maintaining the current value of the charging current; and
   (k) adjusting the predetermined counting value and the predetermined time interval, and the step (c) is repeatedly done.

12. The charging method according to claim 11, wherein if the detected parameter of the battery unit does not reach the threshold value in the step (c), the charging method further comprises a step (l) of judging whether the current value of the charging current is larger than a saturation current value.

13. The charging method according to claim 12, wherein if the current value of the charging current is larger than the saturation current value in the step (l), the step (c) is repeatedly done, wherein if the current value of the charging current is not larger than the saturation current value in the step (l), the charging device is disabled and the battery unit is no longer charged by the charging device.

14. The charging method according to claim 11, wherein if the elapsed time is shorter than the predetermined time interval in the step (g), the step (f) is repeatedly done.

15. The charging method according to claim 11, wherein in the step (k), the current change amount is adjusted according to a set value.

* * * * *